United States Patent
Tara et al.

(10) Patent No.: US 8,434,992 B2
(45) Date of Patent: May 7, 2013

(54) ARM MECHANISM, AND VACUUM ROBOT PROVIDED WITH THE SAME

(75) Inventors: Fumihiro Tara, Fukuoka (JP);
Nobuyuki Furukawa, Fukuoka (JP);
Kensuke Ohni, Fukuoka (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 378 days.

(21) Appl. No.: 12/943,007

(22) Filed: Nov. 10, 2010

(65) Prior Publication Data
US 2011/0120253 A1    May 26, 2011

(30) Foreign Application Priority Data

Nov. 10, 2009 (JP) .............................. P. 2009-257024

(51) Int. Cl.
*B25J 18/04* (2006.01)
*B25J 17/00* (2006.01)
*H01L 21/677* (2006.01)

(52) U.S. Cl.
USPC ..... 414/744.3; 414/917; 414/941; 74/490.01; 901/15; 901/20

(58) Field of Classification Search ............... 414/744.3, 414/917, 941; 74/490.01; 901/15, 20
See application file for complete search history.

(56) References Cited

U.S. PATENT DOCUMENTS

| 4,904,148 | A | * | 2/1990 | Larsson | 414/680 |
| 5,151,008 | A | * | 9/1992 | Ishida et al. | 414/744.5 |
| 6,360,144 | B1 | * | 3/2002 | Bacchi et al. | 700/250 |
| 6,364,599 | B1 | * | 4/2002 | Suwa et al. | 414/744.1 |
| 7,578,649 | B2 | * | 8/2009 | Caveney et al. | 414/744.5 |
| 2002/0148320 | A1 | * | 10/2002 | Kimata et al. | 74/490.01 |

FOREIGN PATENT DOCUMENTS

| JP | 3881579 B2 | 10/2003 |
| JP | 2007-015023 | 1/2007 |

* cited by examiner

*Primary Examiner* — Scott Lowe
(74) *Attorney, Agent, or Firm* — Ditthavong Mori & Steiner, P.C.

(57) ABSTRACT

A first decelerator is placed in an arm base such that a lower end of a decelerator shaft is bared in the arm base. A first arm has a hermetic space which becomes equal in pressure to a hermetic space of the arm base when an upper end of the hollow decelerator shaft is inserted thereinto, and is secured to a first decelerator output shaft. A second decelerator is placed on a distal end of the first arm, and has an input shaft connected to the decelerator shaft. A second arm is secured to an output shaft of the second decelerator, and has no hermetic space formed therein. A link mechanism follows the first and second arms.

8 Claims, 4 Drawing Sheets

ARM MECHANISM, AND VACUUM ROBOT PROVIDED WITH THE SAME

CROSS-REFERENCE TO RELATED APPLICATIONS

The present application claims priority under 35 U.S.C. §119 to Japanese Patent Application No. 2009-257024, filed Nov. 10, 2009. The contents of this application are incorporated herein by reference in their entirety.

BACKGROUND OF THE INVENTION

1. Field of the Invention

The present invention relates to an arm mechanism, and a vacuum robot provided with the same.

2. Discussion of the Background

For example, Japanese Patent No. 3881579 and the like disclose a configuration of an arm of a robot for transferring a substrate. According to the configuration disclosed in Japanese Patent No. 3881579, in order to actuate an arm and a hand of a robot, transmission mechanisms, such as a motor, a decelerator and a timing belt, are placed inside the arm. Occasionally, such a robot is installed in a vacuum container brought into a pressure-reduced state from an atmospheric state, and is used for transfer of a substrate such as a wafer or a glass. The robot, which is installed in the vacuum container, is referred to as a vacuum robot. The vacuum robot causes no damage to the vacuum environment in the vacuum container, and therefore operates while isolating the vacuum environment from the atmospheric environment.

Occasionally, a processing chamber for the substrate is connected around the vacuum container in which the vacuum robot is installed. In some cases, processes are carried out at high temperature in the processing chamber. In the processing chamber, the processes such as etching and CVD are carried out at high temperature under a pressure-reduced environment. For the processes, the vacuum robot needs to transfer the substrate while keeping the high temperature. In such a case, the vacuum container, in which the vacuum robot is installed, undergoes a rise in temperature due to the heat from the substrate and the heat from the processing chamber. The temperature of the substrate itself occasionally rises to a high temperature of 100° C. or more. As one of countermeasures against the problems of heat, for example, JP 2007-015023 A discloses such a solution that a link configuration is adopted for an arm itself.

SUMMARY OF THE INVENTION

According to one aspect of the present invention, there is provided a vacuum robot for transferring a substrate in a pressure-reduced environment. The vacuum robot includes an arm that includes an arm base, an arm driving motor, a first decelerator, a first arm, a second decelerator, a second arm, a first link, a second link, a first coupling link, a second coupling link and a hand. The arm base has a hermetic space formed therein. The arm driving motor is placed in the hermetic space of the arm base. The first decelerator includes a hollow decelerator shaft rotating by reception of a torque from the arm driving motor, and a first decelerator output shaft receiving a torque from the decelerator shaft to reduce a rotation speed by a predetermined ratio and rotating around the decelerator shaft. The first decelerator is placed in the hermetic space of the arm base such that a lower end of the hollow decelerator shaft is bared in the hermetic space. The first arm has a hermetic space which becomes equal in pressure to the hermetic space of the arm base when an upper end of the hollow decelerator shaft is inserted thereinto, and has a proximal end secured to the first decelerator output shaft. The second decelerator is placed on a distal end of the first arm, and has an input shaft connected to the upper end of the decelerator shaft through a transmission mechanism. The second arm has a proximal end secured to an output shaft of the second decelerator, and has no hermetic space formed therein. The first link has a proximal end supported turnably on the arm base. The second link has a proximal end supported turnably on a distal end of the first link. The first coupling link has a first end supported turnably on the proximal end of the second link so as to be coaxial with the proximal end of the second link, and a second end supported turnably on the proximal end of the second arm so as to be coaxial with the proximal end of the second arm. The second coupling link has a first end supported turnably on a distal end of the second link, and a second end supported turnably on a distal end of the second arm. The hand is fastened to the second coupling link.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Embodiments will now be described with reference to the accompanying drawings, wherein like reference numerals designate corresponding or identical elements throughout the various drawings.

Figure 1:
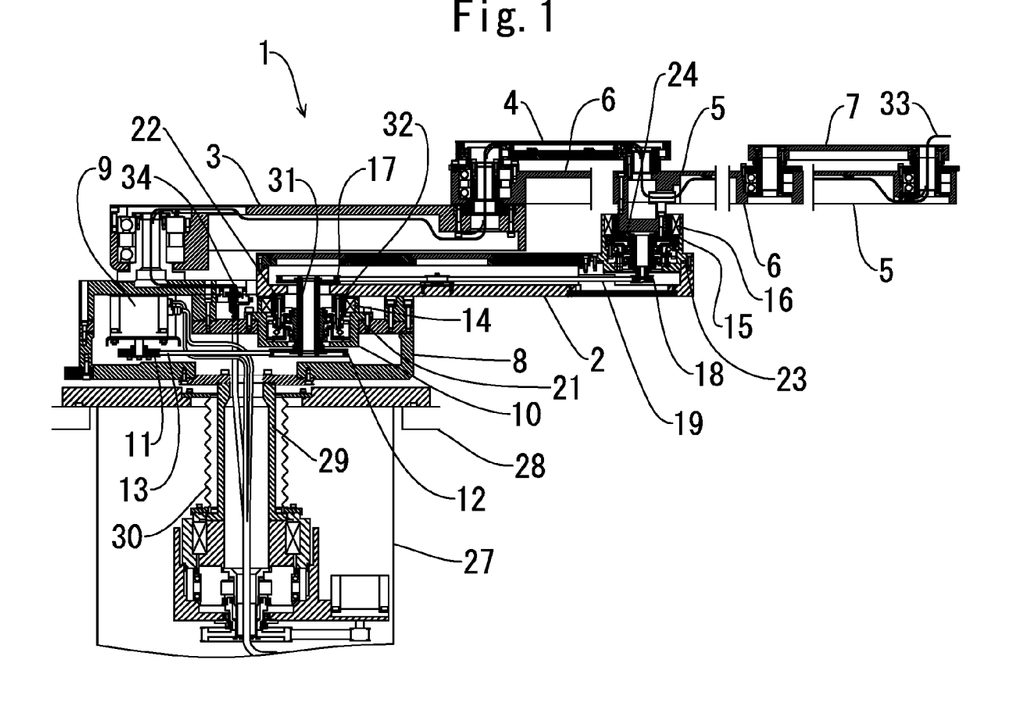
FIG. 1 is a side section view showing an arm of a vacuum robot according to one embodiment of the present invention.
Figure 2:
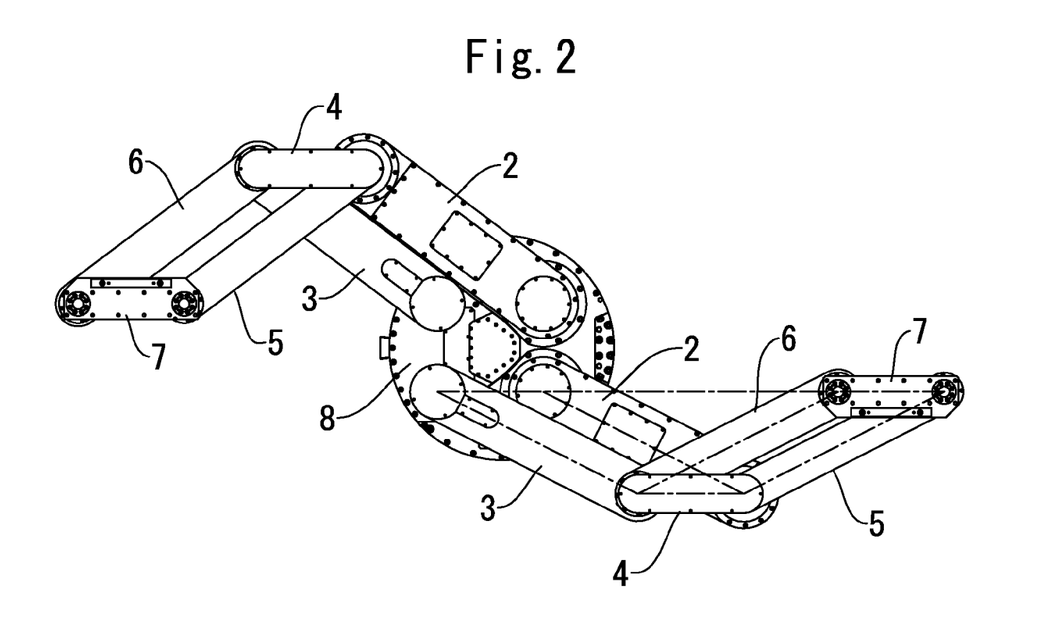
FIG. 2 is a top view of FIG. 1.
Figure 3:
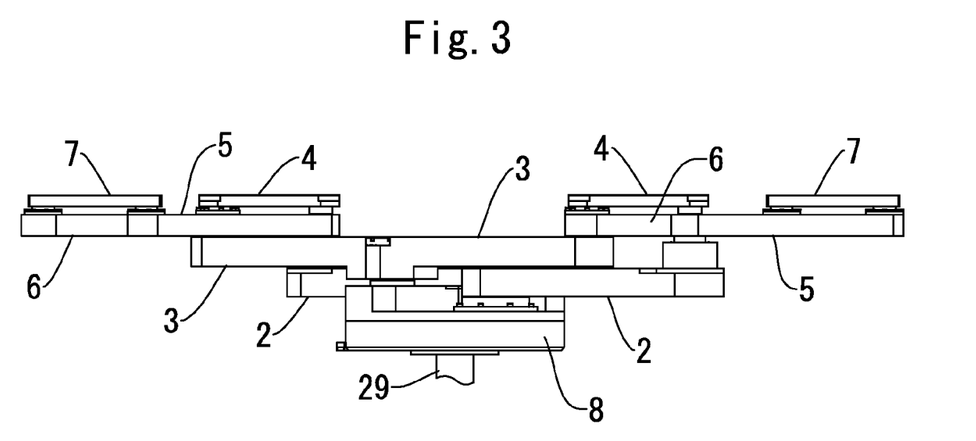
FIG. 3 is an appearance side view of FIG. 1.

FIG. 1 is a side section view that mainly shows an arm part of a vacuum robot according to one embodiment of the present invention. FIG. 2 is a top view of FIG. 1. FIG. 3 is an appearance side view of FIG. 1. As shown in FIG. 2, this embodiment is directed to a so-called dual-arm vacuum robot having two arms. As will be described later, however, no problems occur even when the vacuum robot has only one arm. Herein, the two arms are similar in configuration to each other. Therefore, only the configuration of one of the arms is described below with reference to FIGS. 1 and 2. Herein, the word "vacuum" means a state of a space in which an atmospheric pressure is reduced using a pump or the like.

The arm generally includes a first arm 2, a second arm 5, a first link 3, a second link 6 and a hand (not shown). The first arm 2 is turnable on an arm base 8 (to be described later). The second arm 5 is turnable on a distal end of the first arm 2. The first link 3 is turnable on the arm base 8, and a distal end thereof is coupled turnably to the distal end of the first arm 2 through a first coupling link 4. In the second link 6, a proximal end is coupled turnably to the distal end of the first link 3, and a distal end is coupled turnably to a distal end of the second arm 5 through a second coupling link 7. The hand is secured to the second coupling link 7, and a substrate is mounted thereon. The following description is given about detailed configurations of the respective elements.

In the vacuum robot, a body 27 is secured partly to a vacuum container bottom surface 28. A seal member such as an O ring is attached to a contact interface between the body 27 and the vacuum container bottom surface 28 to maintain a vacuum environment in a vacuum container. The arm base 8 is placed on a top surface of the body 27 so as to turn with respect to the body 27. Elements located above the arm base 8 come into the vacuum container. Although not shown in the figures, a lift mechanism which allows the arm base 8 to move upward and downward and a turn mechanism which allows the arm base 8 to turn are placed in the body 27. A hollow shaft 29 is placed at a center of a lower portion of the arm base 8, and the elements located above the arm base 8 turn in such a manner that the turn mechanism allows the shaft 29 to rotate. Moreover, the elements located above the arm base 8 move upward and downward in such a manner that the lift mechanism allows the shaft 29 to move upward and downward. A bellows 30 is arranged such that the shaft 29 is surrounded therewith. An upper end of the bellows 30 is connected hermetically to a flange formed on the top surface of the body 27. A magnetic fluid seal or the like (not shown) is attached around a lower portion of the shaft 29. A lower end of the bellows 30 is connected hermetically to a member for holding the magnetic fluid seal. Accordingly, a space defined with the bellows 30, the shaft 29 and the magnetic fluid seal (not shown) is exposed to atmosphere in the vacuum container.

The arm base 8 has a hermetic space formed therein. This inner space of the arm base 8 communicates with an inner space of the hollow shaft 29. A cable (to be described later) is distributed from the inner space of the arm base 8 toward the inner space of the shaft 29. A lower end of the hollow shaft 29 communicates with an inner space (not shown) of the body 27. In this embodiment, the body 27 is exposed to an atmospheric environment. Accordingly, the inner space of the shaft 29 and the hermetic inner space of the arm base 8 are also exposed to the atmospheric environment. An arm driving motor 9 is housed in the inner space of the arm base 8. The arm driving motor 9 is secured in the arm base 8 such that an output shaft thereof is oriented in a perpendicular and downward direction. A pulley 11 is secured to the output shaft of the arm driving motor 9.

On the other hand, a first decelerator 10 is secured to the arm base 8 at a height which is almost equal to that of the arm driving motor 9. Specifically, the first decelerator 10 includes a casing, and an outer periphery of the casing is secured to the arm base 8 through a vacuum seal 21. The first decelerator 10 includes a hollow decelerator shaft 31 which penetrates therethrough in a vertical direction. A pulley 12 is secured to a lower end of the decelerator shaft 31. A pulley 17 is secured to an upper end of the decelerator shaft 31. A high speed-side timing belt 13 is wound between the pulley 11 and the pulley 12. This timing belt 13 is referred to as the "high speed-side" timing belt for the following reason. That is, by rotation of the pulley 11, the pulley 12 and the high speed-side timing belt 13, a torque from the arm driving motor 9 is transmitted to the first decelerator 10 without deceleration. Moreover, the pulley 11, the pulley 12 and the high speed-side timing belt 13 rotate at higher speed as compared with a decelerator output shaft 32 (to be described later) of the first decelerator 10.

In the first decelerator 10, the decelerator output shaft 32 is placed outside the decelerator shaft 31. When the decelerator shaft 31 rotates by rotation of the output shaft of the arm driving motor 9, the decelerator output shaft 32 rotates while a rotation speed of the decelerator shaft 31 is reduced at a predetermined ratio. That is, the decelerator shaft 31 rotates at a speed which is reduced by a ratio between the pulley 11 and the pulley 12, and the decelerator output shaft 32 rotates at a speed which is equal to the rotation speed of the decelerator shaft 31. Herein, the rotation speed of the decelerator shaft 31 is further reduced at the predetermined ratio. Accordingly, the decelerator output shaft 32 rotates at a relatively lower speed as compared with the decelerator shaft 31. The decelerator output shaft 32 rotates through a vacuum seal 14 which is rotatable with respect to an inner circumferential plane of the casing of the first decelerator 10. According to the configuration described above, the interior of the first decelerator 10 communicates with the inner space of the arm base 8 because of the hollow shape of the decelerator shaft 31, and is maintained at an atmospheric state.

The first arm 2 has a hermetic space formed therein. A hole is formed on a bottom surface of a proximal end of the first arm 2. The upper end of the decelerator shaft 31 is inserted into the inner space of the first arm 2 through the hole. In the proximal end of the first arm 2, moreover, the bottom surface around the hole is fastened directly to the decelerator output shaft 32. A vacuum seal 22 is attached to the fastened portion in order to keep hermeticity. As described above, the pulley 17 is secured to the upper end of the decelerator shaft 31.

A second decelerator 15 is secured to a top surface of the distal end of the first arm 2. A vacuum seal 23 is attached to the secured interface in order to keep hermeticity in the first arm 2 and the second decelerator 15. The second decelerator 15 is secured to the first arm 2 so as to protrude from the top surface of the distal end of the first arm 2, and is placed such that a height of a pulley 18 secured to an input shaft bared at the bottom surface of the second decelerator 15 is almost equal to that of the pulley 17. A high speed-side timing belt 19 is wound between the pulley 18 and the pulley 17. The second decelerator 15 is set such that the decelerator output shaft 32 of the first decelerator 10 is opposite in rotating direction to an output shaft of the second decelerator 15 when the arm driving motor 9 rotates in a certain direction. A rotatable vacuum seal 16 is attached between the output shaft and a casing in the second decelerator 15 in order to keep hermeticity in the second decelerator 15 even when the output shaft of the second decelerator 15 rotates.

A bottom surface of the proximal end of the second arm 5 is fastened directly to the output shaft of the second accelerator 15. A vacuum seal 24 is attached to this fastened portion in order to keep the hermeticity in the second decelerator 15. Unlike the first arm 2, the second arm 5 has no hermetic space formed therein. The second arm 5 has only a recess formed for weight reduction at an appropriate position. A thickness of the second arm 5 may be fixed appropriately in accordance with a weight of a substrate to be transferred if necessary.

A rotatable shaft is placed on the distal end of the second arm 5. One of two ends of the second coupling link 7 is secured to an upper end of the shaft. The hand (not shown) is secured to the second coupling link 7. A substrate to be transferred is mounted on the hand.

According to this embodiment, as described above, the arm driving motor 9 is placed in the arm base 8 rather than the first arm 2. Therefore, it is possible to decrease the thickness of the first arm 2 in a height direction. Specifically, only the pulley 17, the high speed-side timing belt 19, the pulley 18 and a belt tensioner mechanism (if necessary) are placed in the inner space of the first arm 2. As compared with a conventional configuration that a power source such as a motor is placed at a midpoint to or in an inner space of an arm, therefore, it is possible to provide the first arm 2 having a smaller thickness.

Moreover, the second arm 5 has a simple structure, i.e., has no mechanism formed therein, and requires only a satisfactory thickness in terms of strength. As compared with a conventional configuration that an arm has a mechanism placed therein, therefore, it is possible to provide the second arm 5 having a smaller thickness.

The following description is given about a link mechanism that allows the hand to always be oriented in a fixed direction. As shown in the top view of FIG. 2, the turn mechanism allows the arm base 8 to turn. It is assumed in FIG. 2 that a lateral direction corresponds to a direction that the second coupling link 7, i.e., the hand is desired to proceed or retreat. This direction is referred to as an arm unbending and bending direction or an arm proceeding and retreating direction. In FIG. 2, the rightward direction corresponds to the arm unbending direction (the arm proceeding direction) whereas the leftward direction corresponds to the arm bending direction (the arm retreating direction).

A proximal end of the first link 3 is coupled turnably to the arm base 8. A rotation center of the proximal end of the first link 3 is set at a position obtained by shifting a rotation center of the proximal end of the first arm 2 in the arm retreating direction. Unlike the first arm 2, the first link 3 has no hermetic space formed therein. In other words, the first link 3 is similar in configuration to the second arm 5. The proximal end of the second link 6 is coupled turnably to a top surface of the distal end of the first link 3. Further, one of two ends of the first coupling link 4 is coupled turnably to the top surface of the distal end of the first link 3 on the proximal end of the second link 6 so as to be coaxial with the proximal end of the second link 6. The other end of the first coupling link 4 is coupled turnably to the distal end of the first arm 2 on the proximal end of the second arm 5 coupled to the distal end of the first arm 2 so as to be coaxial with the proximal end of the second arm 5. The distal end of the second link 6 is coupled turnably to the other end of the second coupling link 7. Unlike the first arm 2, the second link 6 also has no hermetic space formed therein. Herein, each of the first coupling link 4 and the second coupling link 6 is a plate-shaped member.

With regard to the arm configuration described above, additional description is given about lengths of the respective elements, and the like.

First, the first arm 2 and the first link 3 are set such that the first arm 2 and the first link 3 are equal to each other in a distance between a rotation axis of the proximal end and a rotation axis of the distal end. Moreover, a distance between the rotation axis of the proximal end of the first arm 2 and the rotation axis of the proximal end of the first link 3 is set to be equal to a distance between rotation axes of the two ends of the first coupling link 4. Thus, a line connecting among the rotation axis of the proximal end of the first arm 2, the rotation axis of the proximal end of the first link 3, the rotation axis of the distal end of the first arm 2 and the rotation axis of the distal end of the first link 3 forms a parallelogram.

Further, each of the second arm 5 and the second link 6 is set such that a distance between a rotation axis of the proximal end and a rotation axis of the distal end is equal to the distance between the rotation axis of the proximal end and the rotation axis of the distal end in the first arm 2. Moreover, the second coupling link 7 is set such that a distance between rotation axes of two ends is equal to the distance between the rotation axes of the two ends of the first coupling link 4. Thus, a line connecting among the rotation axis of the proximal end of the second arm 5, the rotation axis of the proximal end of the second link 6, the rotation axis of the distal end of the second arm 6 and the rotation axis of the distal end of the second link 6 forms a parallelogram.

With regard to a rotation speed of the output shaft of the first decelerator 10 and a rotation speed of the output shaft of the second decelerator 15, further, a speed reducing ratio of the first decelerator 10, a speed reducing ratio of the second decelerator 15, the number of teeth of the pulley 17 and the number of teeth of the pulley 18 are fixed such that the rotation speed of the second decelerator 15 becomes twice as high as the rotation speed of the first decelerator 10.

In this embodiment, a bottom surface of the first link 3 is supported on the arm base 8 so as to be higher in height than a top surface of the first arm 2. The arm driving motor 9 housed in the arm base 8 has a certain height, and a thickness of the arm base 8 in a height direction is almost fixed based on this height. In the arm base 8, accordingly, the proximal end of the first link 3 is supported at a position corresponding to the top surface of the portion where the arm driving motor 9 is housed. On the top surface of the arm base 8, a plane is formed so as to be lower in height than a plane on which the first link 3 is supported. The first decelerator 10 is secured on the lower plane. According to this configuration, the first arm 2 is placed at the position which is lower in height than the position where the first link 3 is placed.

Accordingly, when the first arm 2 turns about the distal end thereof in the arm unbending direction, like the arm (the unbending arm) shown on the lower side in FIG. 2, the first link 3 turns by an amount of turn, which is equal to that of the first arm 2, by the action of the first coupling link 4. Herein, the first link 3 turns so as to overlap with the first arm 2. On the other hand, when the first arm 2 turns about the distal end thereof in the arm bending direction (the arm retreating direction), like the arm (the bending arm) shown on the upper side in FIG. 2, the first arm 2 interferes with the step formed on the top surface of the arm base 8 (the step formed because the arm driving motor 9 is housed). With regard to the first arm 2, therefore, an amount of turn in the arm proceeding direction is different from an amount of turn in the arm retreating direction. In other words, the amount of turn of the first arm 2 at the retreat position is slightly small. Thus, the arm according to this embodiment can be configured to transfer a substrate to a farther position by sacrificing a pull amount of the arm at the retreat position. However, this configuration brings about the decrease of the inner space of the arm base 8. Therefore, it is possible to suppress a possibility of leakage from the inner space into the vacuum environment, and to reduce a required volume of the vacuum container.

As described above, only the pulley 17, the high speed-side timing belt 19, the pulley 18 and the tensioner mechanism (if necessary) are placed in the inner space of the first arm 2. According to this embodiment, as a result, it is possible to realize the first arm 2 having a small thickness. Since the thickness of the first arm 2 is decreased, the atmospheric space is decreased in the vacuum container. Thus, it is possible to produce an advantage of suppressing a possibility that gas is leaked from the atmospheric space into the vacuum atmosphere in the vacuum container. However, the entire arm is degraded in rigidity if the thickness of the first arm 2 is decreased. In order to eliminate this disadvantage, according to this embodiment, the thickness of the first link 3 is set to be larger than the thickness of the first arm 2. Thus, it is possible to enhance the rigidity of the arm while suppressing the possibility of leakage from the first arm 2, and to prevent occurrence of such a problem that the arm is bowed upon transfer of a heavy substrate.

The following description is given about the second arm 5 and the second link 6. With regard to the thickness in the height direction, the second arm 5 and the second link 6 are almost equal to each other in this embodiment. Moreover, the second arm 5 is coupled to the distal end of the first arm 2 and the second link 6 is coupled to the distal end of the first link 3 such that the second arm 5 and the second link 6 become equal in height to each other. With this configuration, the second arm 5 and the second link 6 can pass through a narrow opening without problems. As described above, moreover, each of the second arm 5 and the second link 6 does not house therein a transmission mechanism such as a pulley and a motor. Therefore, the thickness of each of the second arm 5 and the second link 6 can be decreased as long as the rigidity can be ensured. For this reason, the second arm 5 and the second link 6 can pass through a narrow opening without effort. This configuration also produces an advantage of reducing the volume of the vacuum container.

Further, the following description is given about processing for a cable in this embodiment. Occasionally, a sensor that detects a substrate on the hand, a sensor that detects a position of the substrate mounted on the hand (i.e., that detects a deviation amount of the substrate), a sensor that detects a substrate in a cassette, which is placed on the distal end of the hand to house therein a plurality of substrates, and the like are placed near the hand if necessary. With regard to a signal line and a power supply line for such a sensor (hereinafter, collectively referred to as a cable), in this embodiment, a cable 33 is distributed as shown in FIG. 1. Specifically, the cable 33 is led from the hand (not shown), passes through a hollow hole formed on a center of a pivot through which one of the two ends of the second coupling link 7 and the distal end of the second arm 5 are coupled, and then passes a back side of the second arm 5. At the proximal end of the second arm 5, a hollow hole is formed on a center of a pivot through which the second arm 5 and the first coupling link 4 located above the second arm 5 are coupled. This hole extends to the first coupling link 4. The cable 33 reaches the proximal end of the second arm 5, and then is distributed to the first coupling link 4 through this hole. A passage is formed in the first coupling link 4 such that the cable 33 can pass therethrough. This passage is exposed to the vacuum atmosphere in the vacuum container. The cable 33 reaches the other end of the first coupling link 4 through the passage, passes through a hollow hole formed on a center of a pivot through which the proximal end of the second link 6 and the distal end of the first link 3 are coupled, and is distributed to a back side of the first link 3. The cable 33 passes the back side of the first link 3 to reach the proximal end of the first link 3, passes through a hole formed near the proximal end of the first link 3, and is distributed to the upper side of the first link 3. Thereafter, the cable 33 passes through a hollow hole formed on a center of a pivot of the proximal end of the first link 3, and extends downward to the arm base 8. Further, the cable 33 is connected to a corresponding one of current introduction terminals formed on the arm base 8. The current introduction terminals are located between the vacuum atmosphere in the vacuum container and the atmosphere in the hermetic space of the arm base 8 to connect the respective cables between the atmospheres while isolating the atmospheres from each other. Thereafter, the cable 33 is inserted into the hollow hole of the shaft 29, and is connected to an appropriate portion (not shown).

According to this embodiment, the cable is distributed as described above. Therefore, it is possible to prevent such a disadvantage that the cable hinders the operation of the arm or the operation of the link. Moreover, the cable is exposed to the vacuum environment, but does not pass through the first arm 2. Therefore, there is no possibility that the cable comes into contact with the pulley or the belt in the first arm 2.

The following description is given about the operations of the arm configured as described above according to this embodiment.

When the output shaft of the arm driving motor 9 rotates, the decelerator shaft 31 of the first decelerator 10 rotates through the pulley 11, the high speed-side timing belt 13 and the pulley 12. When the decelerator shaft 31 rotates, this rotation speed is reduced by the first decelerator 10. Then, the decelerator output shaft 32 also rotates, so that the first arm 2 turns. Simultaneously, the torque from the pulley 17 on the upper end of the decelerator shaft 31 is transmitted to the second decelerator 15 through the high-speed timing belt 19 and the pulley 18, so that the input shaft of the second decelerator 15 also rotates. The pulley 17 and the pulley 18 are connected to each other through the high speed-side timing belt 19, and therefore rotate in an identical direction. On the other hand, the decelerator output shaft 32 of the first decelerator 10 and the output shaft of the second decelerator 15 rotate in opposite directions at a speed ratio of 1:2. That is, when the first arm 2 turns by a certain amount, the second arm 5 turns twice as large in amount of turn as the first arm 2 in a direction opposite to the turning direction of the first arm 2.

On the other hand, the line connecting among the rotation axis of the proximal end of the first arm 2, the rotation axis of the proximal end of the first link 3, the rotation axis of the distal end of the first arm 2 and the rotation axis of the distal end of the first link 3 forms a parallelogram. Therefore, the first arm 2 and the first link 3 turn simultaneously in parallel with each other. Moreover, the first coupling link 4 moves in parallel with a line connecting between the rotation center of the proximal end of the first arm 2 and the rotation center of the proximal end of the first link 3 (i.e., in parallel with the proceeding and retreating direction).

Likewise, the line connecting among the rotation axis of the proximal end of the second arm 5, the rotation axis of the proximal end of the second link 6, the rotation axis of the distal end of the second arm 5 and the rotation axis of the distal end of the second link 6 forms a parallelogram. Therefore, when the second arm 5 turns, the second link 6 turns in parallel with the second arm 5. Further, the line connecting between the rotation center of the proximal end of the second link 5 and the rotation center of the proximal end of the second link 6, i.e., the line connecting between the rotation axes of the two ends of the first coupling link 4 and the line connecting between the rotation center of the distal end of the second link 5 and the rotation center of the distal end of the second link 6, i.e., the line connecting between the rotation axes of the two ends of the second coupling link 7 shift in parallel with each other.

The first arm 2 and the second arm 5 are equal to each other in the distance between the rotation axis of the proximal end and the rotation axis of the distal end, satisfy the rotation speed ratio of 1:2 with respect to the proximal end. Therefore, the straight line connecting between the rotation axes of the two ends of the second coupling link 7 shifts on the straight line connecting between the rotation center of the proximal end of the first arm 2 and the rotation center of the proximal end of the first link 3.

When being secured onto the second coupling link 7, the hand (not shown) moves straight as shown in FIG. 2 by the action of the parallel link mechanism in accordance with the turning operation (the unbending and bending operation) of the arm. Therefore, the hand can transfer a substrate mounted thereon.

According to this embodiment, as described above, the hermeticity is kept at the arm base 8, the first arm 2 and the second decelerator 15 by means of a rotatable vacuum seal, an O ring and the like. Further, the arm base 8, the first arm 2 and the second decelerator 15 are set at an atmospheric state. Thus, the timing belt, the decelerator, the motor and the like are not exposed to the vacuum environment in the vacuum container. Accordingly, it is possible to realize an arm configuration suitable for a vacuum environment.

In the case where the torque from the arm driving motor 9 in the arm base 8 is transmitted to the first decelerator 10 also placed in the arm base 8, the decelerator shaft 31 that transmits this torque as it is to the first arm 2 through the center of the first decelerator 10 and the decelerator output shaft 32 that receives the torque from the decelerator shaft 31 to reduce the rotation speed and rotates at the reduced rotation speed are coupled to the proximal end of the first arm 2. Moreover, only the transmission mechanism for transmitting the torque from the decelerator shaft 31 is placed in the second arm 2. Further, the second accelerator 15 placed on the distal end of the first arm 2 receives this torque, so that the second arm 5 turns. Therefore, only the transmission mechanism is housed in the first arm 2, but no precise mechanisms are housed in the second arm 5. According to this configuration, it is possible to reduce an amount of leakage from the inner space of the first arm 2. In addition, even in a case where a substrate mounted on the hand is processed at high temperature, there is a low possibility that the second arm 5 undergoes an influence of heat from the substrate. Accordingly, it is possible to maintain a highly accurate substrate transfer state. Moreover, the output shaft of each decelerator is secured directly to the proximal end of the corresponding arm. As a result, it is possible to enhance transmission rigidity as compared with such a mechanism that the timing belt is placed on the output shaft side of the decelerator.

Moreover, the arm driving motor is placed in the arm base rather than the first arm. The first decelerator is placed on a lower one of planes which are different in height from each other. Herein, the different planes are formed because the motor is housed in the arm base. The first arm is supported by the output shaft of the first decelerator. Thus, the position of the first arm is lower in height than the position of the first link, so that the first arm and the first link overlap each other. Therefore, it is possible to avoid interference between the first arm and the first link in the case where the arm unbends. As a result, it is possible to increase the length of the unbending arm. Further, the second arm and the second link, which are almost equal in thickness to each other, are placed at an identical height. Thus, it is possible to suppress enlargement in size of the entire arm in the height direction.

Figure 4:
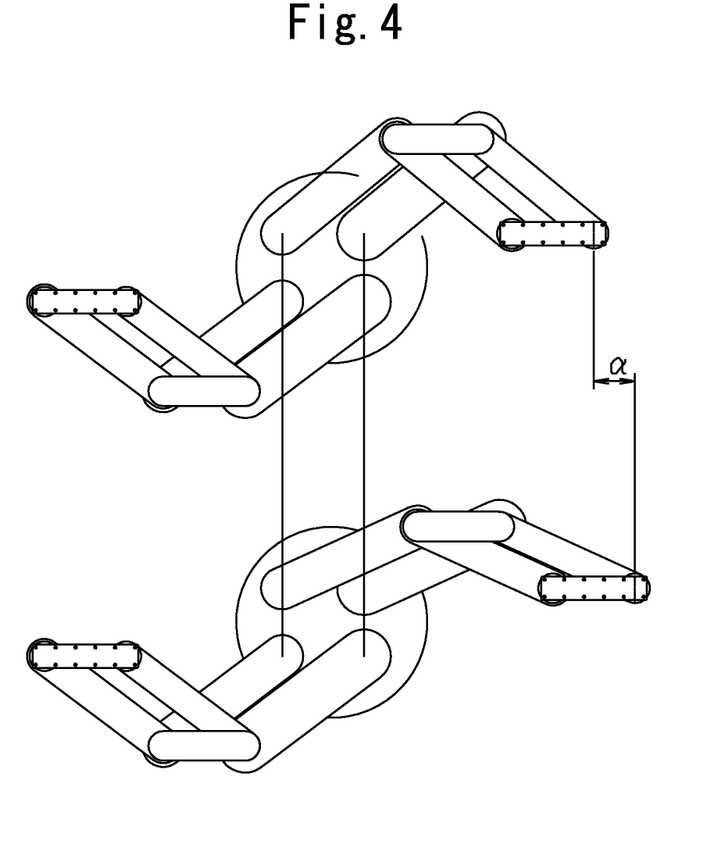
FIG. 4 is a view for illustrating an advantage produced by a difference in height between a first arm and a first link.

FIG. 4 is a top view for illustrating an advantage produced by the difference in height between the first arm and the first link in this embodiment. As shown in FIG. 4, in an example on an upper side, the arm is in an arm unbending state in which the first arm is equal in height to the first link. On the other hand, in an example on a lower side, the arm is in an arm unbending state in which the first arm is different in height from the first link as in this embodiment. According to this embodiment, the length of the unbending arm becomes longer by a value of $\alpha$ in FIG. 4.

Moreover, the arm driving motor is placed in the arm base. Therefore, even in a case of transferring a substrate processed at high temperature, the motor hardly undergoes an influence of heat because the distance from the substrate, which is a heat source, to the motor is long.

Moreover, the parallel link mechanism described above is adopted as a link mechanism for allowing the second coupling link and the hand to move straight, so that the cable can be distributed in the link. That is, the cable is not distributed in the decelerator of each arm, and is also not distributed in the space where the transmission mechanism is placed. Accordingly, it is possible to reduce a risk of disconnection or contact.

According to this embodiment, as described above, it is possible to produce the following advantages.

There is no necessity to place the motor and the decelerator in the vacuum environment. Therefore, it is possible to suppress an amount of gas to be generated in a vacuum.

The first arm and the second arm are driven directly by the respective decelerators. Therefore, it is possible to enhance transmission rigidity as compared with a case where each arm is driven by a timing belt. Moreover, it is possible to transfer an object to be transferred with a linear trail of the bending arm being kept favorably.

The arm driving motor is placed in the atmospheric space of the arm base located below the first arm. Thus, even in a case of transferring a substrate processed at high temperature, it is possible to place the motor at a position spaced away from the substrate. Moreover, it is possible to prevent the motor from undergoing an influence of external heat.

The parallel link mechanism is adopted as a mechanism for allowing the hand to move straight. Thus, it is possible to enhance transmission rigidity of the unbending or bending arm, and to favorably keep a linear trail. Herein, the parallel link mechanism does not merely act as one which restricts the operating direction of the hand, but has a thickness which is equal to or more than those of the first and second arms. Accordingly, it is possible to enhance rigidity of the entire arm. Moreover, the arm and the link allow multipoint support with respect to a transfer mass. Therefore, it is possible to support an object to be transferred under a higher load.

The motor is placed in the arm base located below the first arm, so that no motor is placed in the first arm. Therefore, it is possible to suppress the dimension of the first arm in the height direction. Accordingly, it is possible to place the first arm and the first link at different heights while suppressing the total height of the first arm and the first link. Moreover, it is possible to avoid interference between the first arm and the first link in the height direction. Therefore, it is possible to set the unbending distance of the arm to be longer without increasing the distance between the rotation axis of the first arm and the rotation axis of the first link.

The cable for the sensor that determines whether or not a substrate is mounted on the hand is distributed in the link mechanism side rather than the arm side. Therefore, it is possible to realize safe cable distribution such that the cable does not pass through the decelerator which rotates at high speed.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United States is:

1. A vacuum robot for transferring a substrate in a pressure-reduced environment, the vacuum robot comprising:
   an arm that includes:
      an arm base having a hermetic space formed therein;
      an arm driving motor placed in the hermetic space of the arm base;
      a first decelerator including a hollow decelerator shaft rotatable by reception of a torque from the arm driving motor, and a first decelerator output shaft provided to receive a torque from the hollow decelerator shaft to reduce a rotation speed by a predetermined ratio and rotatable around the hollow decelerator shaft, the first decelerator being placed in the hermetic space of the arm base such that a lower end of the hollow decelerator shaft is bared in the hermetic space;

a first arm having a hermetic space which becomes equal in pressure to the hermetic space of the arm base when an upper end of the hollow decelerator shaft is inserted thereinto, and having a proximal end secured to the first decelerator output shaft;

a second decelerator placed on a distal end of the first arm, and having an input shaft connected to the upper end of the hollow decelerator shaft through a transmission mechanism;

a second arm having a proximal end secured to an output shaft of the second decelerator, and having no hermetic space formed therein;

a first link having a proximal end supported turnably on the arm base;

a second link having a proximal end supported turnably on a distal end of the first link;

a first coupling link having a first end supported turnably on the proximal end of the second link so as to be coaxial with the proximal end of the second link, and a second end supported turnably on the proximal end of the second arm so as to be coaxial with the proximal end of the second arm;

a second coupling link having a first end supported turnably on a distal end of the second link, and a second end supported turnably on a distal end of the second arm; and a hand fastened to the second coupling link.

2. The vacuum robot according to claim 1, wherein the first link is supported on the arm base such that a bottom surface of the first link is higher in height than a top surface of the first arm.

3. The vacuum robot according to claim 2, wherein in the arm base, the first link is supported on a top surface of a portion where the arm driving motor is housed and the first decelerator is placed on a plane which is lower in height than the top surface of the portion where the arm driving motor is housed such that the bottom surface of the first link is higher in height than the top surface of the first arm.

4. The vacuum robot according to claim 2, wherein the second arm is coupled to the first arm and the second link is coupled to the first link such that a thickness of the second arm in a height direction is substantially equal to a thickness of the second link in the height direction and the second arm is equal in height to the second link.

5. The vacuum robot according to claim 1, wherein a thickness of the first link in a height direction is larger than a thickness of the first arm.

6. The vacuum robot according to claim 1, wherein a cable is led from the hand, is distributed from the first end of the second coupling link to a back side of the second arm, is distributed to the first coupling link through a hole formed on the proximal end of the second arm, is distributed from the distal end of the first link to a back side of the first link, passes a rotation center of the proximal end of the first link, and is connected to a current introduction terminal formed on the arm base.

7. The vacuum robot according to claim 1, further comprising:

a shaft that communicates with the hermetic space of the arm base;

a turn mechanism that allows the shaft to rotate;

a lift mechanism that allows the shaft to move upward and downward; and a body that houses therein the shaft, the turn mechanism and the lift mechanism.

8. An arm mechanism of a robot for transferring a substrate in a pressure-reduced environment, the arm mechanism comprising:

an arm base having a hermetic space formed therein;

an arm driving motor placed in the hermetic space of the arm base;

a first decelerator including a hollow decelerator shaft rotatable by reception of a torque from the arm driving motor, and a first decelerator output shaft provided to receive a torque from the hollow decelerator shaft to reduce a rotation speed by a predetermined ratio and rotatable around the hollow decelerator shaft, the first decelerator being placed in the hermetic space of the arm base such that a lower end of the hollow decelerator shaft is bared in the hermetic space;

a first arm having a hermetic space which becomes equal in pressure to the hermetic space of the arm base when an upper end of the hollow decelerator shaft is inserted thereinto, and having a proximal end secured to the first decelerator output shaft;

a second decelerator placed on a distal end of the first arm, and having an input shaft connected to the upper end of the hollow decelerator shaft through a transmission mechanism;

a second arm having a proximal end secured to an output shaft of the second decelerator, and having no hermetic space formed therein;

a first link having a proximal end supported turnably on the arm base;

a second link having a proximal end supported turnably on a distal end of the first link;

a first coupling link having a first end supported turnably on the proximal end of the second link so as to be coaxial with the proximal end of the second link, and a second end supported turnably on the proximal end of the second arm so as to be coaxial with the proximal end of the second arm;

a second coupling link having a first end supported turnably on a distal end of the second link, and a second end supported turnably on a distal end of the second arm; and a hand fastened to the second coupling link.

* * * * *